United States Patent [19]

Lefevre

[11] Patent Number: 4,820,897

[45] Date of Patent: * Apr. 11, 1989

[54] PROCESS FOR PRODUCING MINIATURE PIEZOELECTRIC DEVICES USING LASER MACHINING AND DEVICES OBTAINED BY THIS PROCESS

[76] Inventor: René Lefevre, 8 allée Van Gogh, 78160 Marly, France

[ * ] Notice: The portion of the term of this patent subsequent to Nov. 11, 2004 has been disclaimed.

[21] Appl. No.: 51,263

[22] Filed: May 5, 1987

Related U.S. Application Data

[63] Continuation of Ser. No. 686,283, Dec. 26, 1984, abandoned.

[30] Foreign Application Priority Data

Dec. 28, 1983 [FR] France ............................ 83 20963

[51] Int. Cl.⁴ .............................................. B23K 26/00
[52] U.S. Cl. ...................... 219/121.67; 219/121 LM; 219/121 LJ; 219/121 LA; 219/121.61; 219/121.69; 219/121.85; 29/25.35; 310/311; 310/367
[58] Field of Search ................. 219/121 LM, 121 LN, 219/121 LG, 121 LH, 121 LS, 121 LK, 121 L, 121 LA; 29/25.35; 310/312, 359, 360, 339, 367, 368, 311; 350/331 R

[56] References Cited

U.S. PATENT DOCUMENTS

| | | | |
|---|---|---|---|
| 3,629,545 | 12/1971 | Graham | 219/121 LN |
| 3,899,428 | 8/1975 | Avston et al. | 332/7.51 |
| 4,109,359 | 8/1978 | Cross et al. | 310/359 |
| 4,131,484 | 12/1978 | Caruso et al. | 219/121 LM |
| 4,224,547 | 9/1980 | Miller | 310/312 |
| 4,243,300 | 1/1981 | Richards et al. | 350/355 |
| 4,355,457 | 10/1982 | Barlett et al. | 29/583 |
| 4,388,146 | 6/1983 | Ballato | 219/121 LM |
| 4,468,582 | 8/1984 | Fujiwara et al. | 310/312 |
| 4,583,063 | 4/1986 | Milsom | 310/368 |

FOREIGN PATENT DOCUMENTS

A0078089 5/1983 European Pat. Off. .
2518478 11/1975 Fed. Rep. of Germany .

OTHER PUBLICATIONS

American Ceramic Bulletin—"Scribing Glass with Pulsed and Q-Switched CO2 Laser"—, vol. 52, #11, 11/1973.
Patent Abstracts of Japan, vol. 4, No. 181(E-37)(633), Dec. 13, 1980 and JP-A-55 124 282 (Matsushita Denki Sangyo K.K.) (25-09-1980).

Primary Examiner—M. H. Paschall
Attorney, Agent, or Firm—Pearne, Gordon, McCoy & Granger

[57] ABSTRACT

Process for the production of miniature piezoelectric devices using machining by laser and devices obtained by this process.

The piezoelectric material formed by lithium niobate or lithium tantalate is cut by means of the laser.

Application to the production or resonators and filters, which can be used in electronics.

4 Claims, 1 Drawing Sheet

PROCESS FOR PRODUCING MINIATURE PIEZOELECTRIC DEVICES USING LASER MACHINING AND DEVICES OBTAINED BY THIS PROCESS

This is a continuation of application Ser. No. 686,283, filed on 12/26/84 abandoned.

BACKGROUND OF THE INVENTION

The present invention relates to a process for producing miniature piezoelectric devices using laser machining and devices obtained by this process.

A piezoelectric device can be in various forms. One of the simplest forms consists of a thin plate or wafer metallized on both faces. Other forms or shapes of varying complexity are possible, such as a sequence of plates connected by bridges, tuning forks, etc. The essential property used in such devices is their resonance. However, coupled resonators can lead to filtering properties of the band pass type.

If a filter is formed from several coupled piezoelectric resonators and if said resonators are machined in the same piezoelectric substrate a so-called monolithic filter is obtained. By analogy, a polylithic filter is obtained by the cascade association of several monolithic cells.

The term piezoelectric devices is understood to means all said class of means covering piezoelectric resonators, piezoelectric filters, of either the monolithic or polylithic type, as well as any other combination of such elements having a given transfer function.

Such devices have a very wide range of applications:
particularly mobile, fixed reception, medium frequency filtering,
filtering for radio reception antenna (for increasing the signal-to-noise ratio),
fixed or mobile instrumentation, construction of oscillators with a large frequency sweep (VCXO),
electronic watches and clocks.

The processes for producing such devices, when they are of the miniature type, use two different techniques, as a function of whether the piezoelectric material used is quartz or one of the new materials constituted by lithium niobate and tantalate.

In the case of quartz, the procedure used is photolithography. A photosensitive resin is deposited on a quartz substrate and is irradiated for forming lines corresponding to the pattern to be cut, which is followed by chemical etching of the quartz, e.g. using a boiling hydrofluoric acid solution.

In the case of lithium niobate or lithium tantalate, this procedure is unsuitable, because the chemical etching speed of these materials by the acid is much too low. Thus, the etching speed of quartz by boiling hydrofluoric acid is approximately 74 $\mu$m/hour, whereas that of lithium tantalate by a hydrofluoric and nitric acid solution is only 1.6 $\mu$m/hour.

Thus, in the case of lithium tantalate, photolithography is considered to be unsuitable because, in view of the thicknesses of the wafers to be machined (200 $\mu$m) there would be a significant underetching phenomenon, which would lead to a poor definition of the edges of the patterns. Moreover, the photosensitive resin would be destroyed.

For this reason, preference is given to the use of another procedure, i.e. sawing. For this purpose, use is made of a diamond saw having multiple blades or wires.

With regards to the lithium tantalate piezoelectric devices, reference can be made to a number of articles which appeared in the journal "Symposium on Frequency Control", namely:

the article entitled "Low frequency resonators of lithium tantalate" by ONOE SHINADA (Kinsekisha Ltd.), 1973, p. 42;

the article entitled "Miniature LiTaO$_3$ X-cut strip resonator", 1983, by OKAZAKI, WATANABE (NDK), p. 337;

and finally the article entitled "Miniaturized LiTaO$_3$ strip resonator", 1983, by FUJIWARA (Fujitsu), p. 343.

The characteristics of the resonators and filters produced from lithium niobate and tantalate are complementary of those of those of their quartz homologs. However, for resonators, the frequency sweep is greater and for filters the relative pass band is wider. Their range of use varies between a few dozen kHz to approximately 30 MHz, and this can be broken down into a number of ranges as a function of the crystal section chosen.

However, despite the interest provided by lithium niobate and tantalate, it must be omitted that they are not very suitable for obtaining complex shapes, due to the sawing procedure used. Thus, it is necessary to make do with very simple shapes, such as rectangular bars or tuning forks, which does not make it possible to easily optimize certain parameters, such as the overvoltage. The sawing problems also prevent the production of monolithic filters in the sense defined hereinbefore. Thus, it is not possible when using a saw to remove material in closed areas with often millimetric and submillimetric dimensions. In order to obtain filters with several resonators in cascade, it is necessary to separately produce resonators in different piezoelectric substrates and then assemble these different devices by electrical connections. Thus, there are no lithium niobate or lithium tantalate multi-resonator monolithic filters.

Moreover, sawing implies that the part to be machined has relatively large dimensions, due to the fragility of the crystals, so that it is difficult to reach high operating frequencies (beyond 1 MHz) for crystal sections using elongation modes.

A further difficulty is presented by the regulation or setting of the devices obtained. No matter whether the production method involves photolithography or sawing, its reproducibility is often of a random nature, and the device obtained only rarely has the expected characteristics. It is then necessary to carry out an adjustment (e.g. of the resonant frequency). This involves filing by using several different methods, some parts of the pattern, particularly the ends. Obviously this operation is far from easy and considerably extends the production time.

Finally, the prior art sawing procedure is not appropriate for programming production installations, which is indispensable if the production process it to be given a true industrial character.

SUMMARY OF THE INVENTION

The object of the present invention is to obviate all these disadvantages. Therefore the invention proposes a novel process for the production of piezoelectric devices using lithium tantalate or lithium niobate and which makes it possible to obtain resonators having a random and even very complex shape, monolithic filters (which did not hitherto exist, even in quartz, particularly in the low frequency range of a few kHz at 4 MHz) and naturally polylithic filters. Moreover, the process according to the invention leads to a very simple and very sensitive regulating or setting operation, the cutting and regulating process being suitable for programming and inspection or control by informatics means.

According to the invention, all these objectives are achieved by cutting the piezoelectric material with a laser beam.

In order to better appreciate the originality of the invention, it must be understood that the cutting of the lithium tantalate or lithium niobate by a laser beam with a view to obtaining piezoelectric devices was a priori inappropriate for a number of reasons.

The first reason is that these materials are transparent, so that the absorption of near infrared or visible laser radiation is very small and could not lead to an adequate thermal effect to bring about the melting of the crystal. This is why the laser machining process is used more particularly on absorbent materials (refractory materials, fabrics, etc.), but is very unsuitable for use e.g. in the cutting of glass. The second reason is that the product which it is wished to obtain must have exceptional qualities, particularly in its crystalline structure, in order to obtain high performance piezoelectric devices. However, any prolonged thermal effect is thought to upset the crystal lattice of a material, particularly if it has to be extended to the melting thereof.

A priori, it could be feared that the laser cutting of materials such as lithium niobate or tantalate would be confronted by considerable difficulties, both from the standpoint of the effectiveness of performance and from that of the quality of the products obtained.

Surprisingly the Applicant has found that these two obstacles could be overcome. The first, relating to the absorption of light radiation, can be overcome by the use of short, intense light pulses. It has been shown that each of these pulses causes a local breakdown of the material as a result of the electric field carried by the radiation, which suddenly increases the absorption coefficient. The end of the light pulse can then be absorbed. The second obstacle is also overcome if it is evaluated on the basis of the excellent acoustic and piezoelectric qualities of the devices obtained after analysis.

More specifically, the invention therefore relates to a process for the production of piezoelectric devices, in which a piezoelectric material is cut in order to give it an appropriate shape. This process is characterized in that the piezoelectric material is taken from the group including lithium tantalate and lithium niobate, the material being cut with a laser beam operating under pulse-like conditions.

According to an advantageous arrangement, the material to be cut and the laser beam are displaced relative to one another by a movement formed by a succession of displacements and stops, the cutting of the material taking place during the stops. The melting zones of the material may not overlap and there is then a dotted line cutting of the motif of the "postage stamp" type.

The invention also relates to piezoelectric devices with a pattern of piezoelectric material, whose two faces are covered by a conductive coating. These devices are characterized in that the pattern is cut in a piezoelectric material taken from the group including lithium tantalate and lithium niobate using the process defined hereinbefore.

In particular, the invention covers devices with at least two coupled resonators forming a single part cut from the same piezoelectric substrate (monolithic filters as defined hereinbefore). It also covers resonators having complex shapes and/or having clips or tags designed in order to optimize the overvoltage. These devices cannot be manufactured from lithium tantalate or niobate when using the known processes.

According to an exemplified embodiment, the Applicant cut lithium niobate with pulses having a wavelength of 1.06 $\mu$m, 500 Watt peak, lasting 200 ns and having a repetition rate of 800 Hz. The material to be cut is fixed to a set of tables ensuring, by means of stepping motors, the displacement thereof relative to the laser beam. In order to prevent cracks and thermal shocks in the material and to obtain fast cutting, the displacement speed of the table is modified by stops in the manner described hereinbefore. For example, the table advances 20 $\mu$m at a speed of 0.3 mm/s, stops for 50 ms and then advances again for 20 $\mu$m, etc. Furthermore and with the same aim of preventing cracks caused by thermal shocks, it is ensured that starting does not take place at the edge of the wafer and it is ensured that the latter is fitted in such a way that air is in contact with both faces.

Although it is possible to use lasers operating in the visible range (e.g. ruby lasers), it would appear that lasers operating in the near infrared (1.06 $\mu$m) are very suitable (neodymium-doped glass laser and in particular YAG laser).

Numerous tests were carried out by the Applicant on resonators of the bar and tuning fork types, on monolithic filters with two or four resonators formd from bars or tuning forks and on combinations of monolithic cells with two resonators (polylithic filters). These tests have made it possible to make the following statements:

(1) the cutting of the pattern is very precise;
(2) the loss of material is very small, because the laser beam is focused on to a spot whose diameter does not exceed 15 $\mu$m (it is difficult to drop below this dimension because the thickness of the crystal to be cut is approximately 200 $\mu$m);
(3) the acoustic quality of the devices obtained is not inferior to that obtained with devices produced by sawing;
(4) the piezoelectric quality is also not inferior, the proportion of degraded material in the vicinity of the cut being the same as that in the case of sawing, which is confirmed by limited ageing over a period of several months and an electromechanical coupling coefficient value which is very close to that of the bars produced by sawing;
(5) the dimensional reproducibility is excellent so that it is possible to come very close to the final characteristics of the devices whilst reducing the regulating and setting phase;
(6) the dimensions and shapes can be adjusted with the very laser used for cutting, if it is wished to optimize the various operating parameters or reduce the parasitic modes.

For illustrative purposes, the properties of the filters obtained according to the invention are as follows:
maximum relative band width obtained without linked compensated elements: approx. 2% for an undulation or ripple of 0.2 dB;
insertion loss for four resonators: <0.05 dB;

rejection of interference in an attenuated band >60 dB for a monolithic cell and >90 dB for the combination of two or more cells;

overvoltages obtained on resonators and filters:
approx. 60,000 at 455 kHz
approx. 80,000 at 1 MHz
approx. 95,000 at 2 MHz.

the two faces are then metallized through a mask, with the exception of the coupling bridges 21, 22, 23 (FIG. 1b);

sockets are then fitted on each face in the centre of the end bars A and B ($16_A$, $18_A$, $16_B$, $18_B$);

the intermediate resonators are electrically short-circuited;

part 14 is cut with a laser to free the pattern;

the pattern is fitted in its box;

it is adjusted or set using the same laser by machining the ends of the bars and the width of the couplers 21, 22, 23;

the box is then sealed under vacuum;

the device is adapted to obtain the final characteristics of the filter.

FIG. 2 shows the diagram of the possible installation making it possible to perform the process according to the invention. The installation shown comprises a laser 30, a deviating mirror 32, focusing optics 34, a machining table 36 supporting a plate 40 to be machined, said table being controlled in double translation X and Y by two stepping motors 42, 44. The working plane is illuminated by a source 46. A mirror 48, which is transparent to the radiation of the laser and reflecting for the radiation of the source 46, reflects the image of the plate being machined on to a video camera 50 connected to a television receiver 52.

The overall dimensions for bar-type filters are:
6.32×1.7 mm at 455 kHz
3.16×1.1 mm at 1 MHz
1.5×0.6 mm at 2 MHz

BRIEF DESCRIPTION OF THE DRAWINGS

The invention is described in greater detail hereinafter relative to the attached drawings, wherein show.

DETAILED DESCRIPTION OF THE INVENTION

Figure 1B:
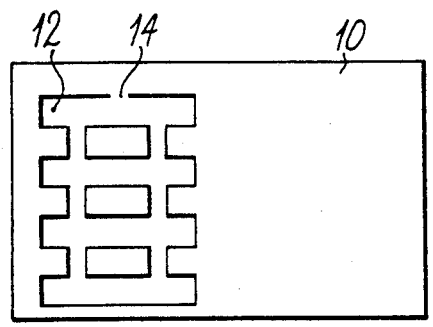
FIG. 1 (1a, 1b) an exemplified embodiment of monolithic filter obtained according to the invention.
Figure 1A:
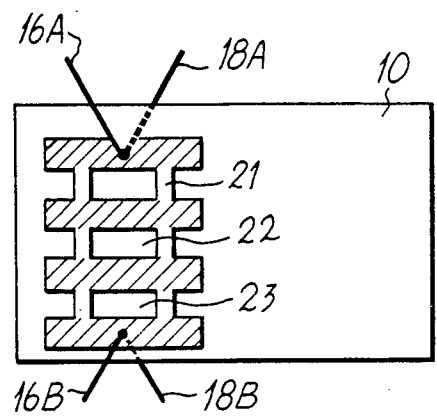
Figure 2:
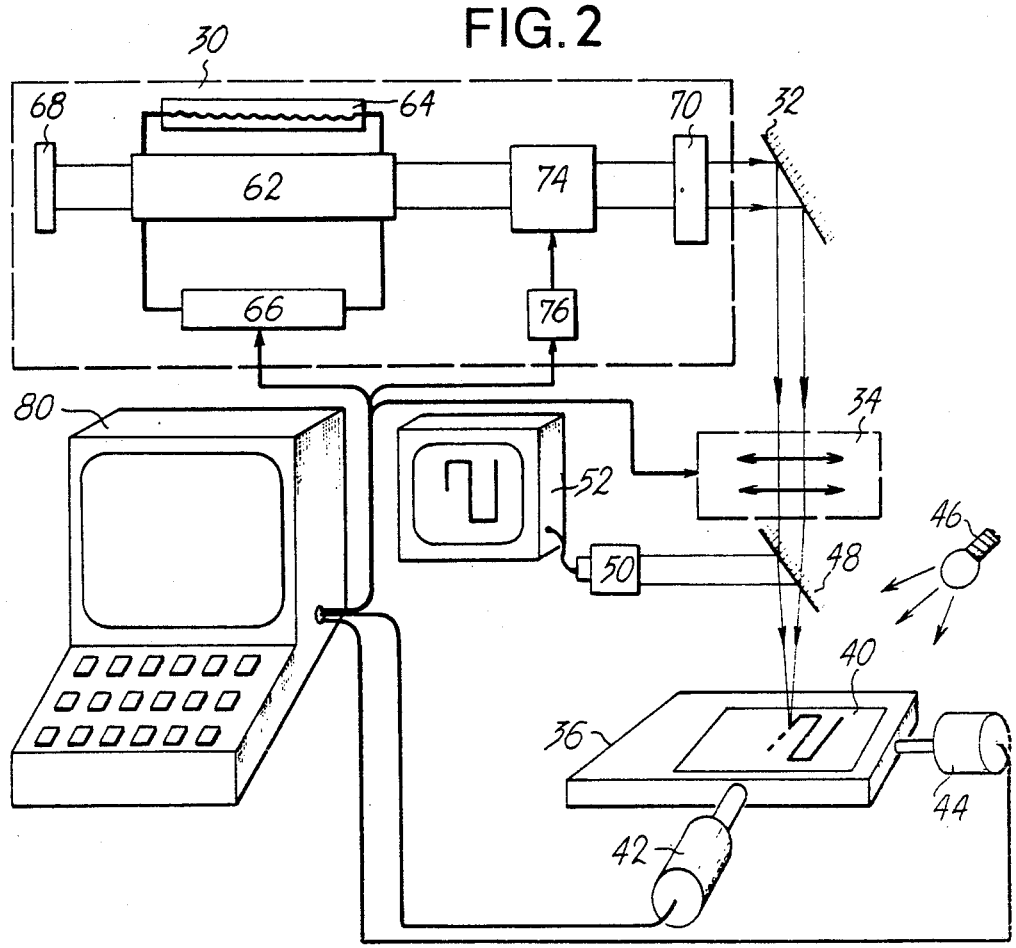
FIG. 2 a diagram showing a possible installation for performing the invention.

FIG. 1 shows an example of a monolithic filter based on four resonators. The filter functions at 455 kHz and is made from lithium tantalate. The following operations are performed for obtaining the same:

start with a 16×12 mm, 150 μm thick lithium tantalate wafer 10, whose faces are smoothed by grinding;

using a e.g. YAG laser, as described hereinbefore, a pattern is cut along line 12;

an uncut portion 14 is left to ensure that the pattern does not become detached during the subsequent manipulations (FIG. 1a);

the wafer and its pattern are cleaned to remove all residues and dust due to the cutting operation;

Laser 30 comprises an amplifier bar 62 optically pumped by halogen lamps 64 supplied by a power supply 66 and two mirrors 68, 70 forming a cavity in which is arranged an acoustooptical or electrooptical device 74 (e.g. a Pockels cell), which acts as a shutter and makes it possible to operate the laser in the Q-switched mode. This shutter is controlled by a voltage generator 76.

An informatics means 80 comprising a microprocessor, a keyboard and a display screen, controls the circuit 66 determining the excitation pulsing of the laser, the circuit 76 triggering the emission of the light pulses, the focusing optics 34 and motors 42, 44. The operator follows the machining on the receiver 52. The means 80 is programmed as a function of the pattern to be obtained.

What is claimed is:

1. A process for producing piezoelectrical devices, in which a piezoelectric material is cut to give it an appropriate shape, comprising the steps of choosing the piezoelectric material from the group including lithium tantalate and lithium niobate, cutting the said piezoelectric material with a laser beam, said laser beam having a wavelength chosen so that the piezoelectric material is substantially transparent to the laser beam, the laser beam operating in a pulse manner to effect the said cutting of the piezoelectric material.

2. A process according to claim 1, wherein the material to be cut and the laser beam are displaced relative to one another by a movement formed from a succession of displacements and stops, the cutting of the material taking place during the stops.

3. A process according to claim 1, wherein the laser operates in the near infrared at a wavelength of 1.06 μm.

4. A process according to claim 1, wherein, after cutting, the characteristics of the device obtained are adjusted by removing material by means of the laser used for the cutting.

* * * * *